United States Patent
Drouere et al.

(10) Patent No.: US 10,274,529 B2
(45) Date of Patent: Apr. 30, 2019

(54) METHOD AND DEVICE FOR MONITORING AND ESTIMATING A PERIODIC VOLTAGE OF A MEDIUM VOLTAGE ELECTRICAL CIRCUIT

(71) Applicant: Schneider Electric Industries SAS, Rueil Malmaison (FR)

(72) Inventors: Bernard Drouere, Apprieu (FR); Julien Mecreant, Seyssinet (FR)

(73) Assignee: SCHNEIDER ELECTRIC INDUSTRIES SAS, Rueil Malmaison (FR)

(*) Notice: Subject to any disclaimer, the term of this patent is extended or adjusted under 35 U.S.C. 154(b) by 302 days.

(21) Appl. No.: 14/863,695

(22) Filed: Sep. 24, 2015

(65) Prior Publication Data
US 2016/0091548 A1    Mar. 31, 2016

(30) Foreign Application Priority Data
Sep. 29, 2014 (FR) ...................... 14 59196

(51) Int. Cl.
    *G01R 19/00*    (2006.01)
    *G01R 19/04*    (2006.01)
    (Continued)

(52) U.S. Cl.
    CPC ......... *G01R 31/02* (2013.01); *G01R 19/0084* (2013.01); *G01R 19/2513* (2013.01);
    (Continued)

(58) Field of Classification Search
    None
    See application file for complete search history.

(56) References Cited

U.S. PATENT DOCUMENTS

| | | | | |
|---|---|---|---|---|
| 3,584,259 A | * | 6/1971 | traub ...................... | H02H 3/253 361/85 |
| 3,727,103 A | * | 4/1973 | Finch ..................... | H02H 3/021 307/127 |

(Continued)

FOREIGN PATENT DOCUMENTS

| DE | 10 2011 085 516 A | 5/2013 |
|---|---|---|
| EP | 2 731 220 A1 | 5/2014 |

OTHER PUBLICATIONS

French Preliminary Search Report dated Jun. 8, 2015 in French Application 14 59196, filed on Sep. 29, 2014 (with English Translation of Categories of Cited Documents).

(Continued)

*Primary Examiner* — J. H. Hur
(74) *Attorney, Agent, or Firm* — Oblon, McClelland, Maier & Neustadt, L.L.P.

(57) ABSTRACT

A method of estimating a periodic voltage, such as an input voltage, of one of the phases of an electrical circuit with at least two phases including a voltage sensor for each of its phases, each voltage sensor being capable of outputting a signal representative of at least a part of period of the periodic voltage of the phase. The method including the following steps: measure the representative signal starting from the voltage sensor; amplify the representative signal by a gain determined in the absence of an electrical fault in the circuit and based on a reference voltage common to all phases in the electrical circuit (1); use the amplified representative signal to estimate the periodic voltage. A device for estimating a voltage and an electrical circuit including such a device.

14 Claims, 9 Drawing Sheets

(51) Int. Cl.
  *G01R 19/25*  (2006.01)
  *G01R 19/30*  (2006.01)
  *G01R 25/00*  (2006.01)
  *G01R 31/02*  (2006.01)
  *G01R 19/155*  (2006.01)

(52) U.S. Cl.
  CPC ............ *G01R 25/005* (2013.01); *G01R 19/04* (2013.01); *G01R 19/155* (2013.01); *G01R 19/30* (2013.01)

(56) References Cited

U.S. PATENT DOCUMENTS

| | | | | |
|---|---|---|---|---|
| 3,745,375 | A * | 7/1973 | Huruse | H02H 3/34 327/3 |
| 3,848,160 | A * | 11/1974 | Boothman | H02H 3/34 361/76 |
| 4,210,948 | A * | 7/1980 | Waltz | G01R 29/16 324/86 |
| 4,723,189 | A * | 2/1988 | Larsen | G01R 29/18 307/127 |
| 4,811,236 | A | 3/1989 | Brennen et al. | |
| 4,933,630 | A * | 6/1990 | Dupraz | G01R 15/181 324/107 |
| 6,420,876 | B1 * | 7/2002 | Saha | G01R 31/088 324/522 |
| 6,529,013 | B2 * | 3/2003 | Skendzic | G01R 15/06 324/607 |
| 2005/0207198 | A1 | 9/2005 | Fu et al. | |
| 2013/0158909 | A1 | 6/2013 | Yang et al. | |

OTHER PUBLICATIONS

U.S. Appl. No. 14/865,635, filed Sep. 25, 2015, Drouere et al.

* cited by examiner

METHOD AND DEVICE FOR MONITORING AND ESTIMATING A PERIODIC VOLTAGE OF A MEDIUM VOLTAGE ELECTRICAL CIRCUIT

TECHNICAL FIELD

The invention relates to the field of medium voltage electrical circuits and equipment capable of monitoring the state of these electrical circuits.

STATE OF PRIOR ART

Monitoring of medium voltage electrical circuits with at least two phases is an essential problem that has to be solved to be able to predict, detect and/or correct a failure or malfunction in these electrical circuits. This monitoring is done using various equipment, particularly in order to determine the state of the power supply, the voltage phase and the quantity of current passing through them, for each phase of equipped circuits.

In the above and throughout the remainder of this document, a medium voltage electrical circuit is a circuit in which the working voltage is between 1 and 35 kV, and usually between 15 and 20 kV. A low voltage electrical circuit is a circuit in which the operating voltage is less than 1 kV, the low voltage in France usually being 0.4 kV. Conventionally, the changeover from a medium voltage electrical circuit such as a medium voltage distribution network to a low voltage electrical circuit such as a customer installation of a manufacturer or one or several private individuals, is made through a transformer.

Monitoring equipment for medium voltage electrical circuits is usually integrated into equipment performing other functions such as breaking or remote control of these circuits, for economic reasons. This integration controls the technologies used for such monitoring equipment. Thus, it is relatively easy to quantify the current passing through a medium voltage circuit with acceptable precision, particularly by means of telecontrol equipment, since pick up of medium voltage is still relatively difficult.

It is known that such information can be obtained by measuring the voltage at capacitor bushings. However, the value of capacitor bushings is very variable depending on the temperature and aging. Thus, voltage values obtained are not very reliable, a difference of ±25% is accepted in France, and especially there can be an unbalance between the different phases of the electrical circuit. Therefore, the only usable information for such equipment is related to the phase.

Document EP 2731220 A1 discloses how this disadvantage can be overcome by using voltage sensors in a low voltage circuit connected to the medium voltage circuit in order to correct voltages measured at capacitor bushings. Sensors used in low voltage circuits are usually not affected by the variability of sensors installed in capacitor bushings. Therefore it is possible to estimate the value of voltages in medium voltage circuits with a precision of the order of 0.5 to 1%. Thus, by combining information about the phase obtained through sensors installed on capacitor bushings with the voltage value estimated from sensors in the low voltage circuit, it is possible to estimate the voltage in each phase of the medium voltage circuit precisely.

However, such a voltage estimation that combines a measurement on the medium voltage circuit and a measurement on the low voltage circuit is relatively complex to set up.

PRESENTATION OF THE INVENTION

The invention aims at overcoming this disadvantage and thus its purpose is to provide a method of estimating a voltage in an electrical circuit with at least two phases such as a medium voltage circuit, said method being capable of estimating a voltage of one of the phases of said electrical circuit that is directly comparable with another voltage of the same type estimated on the other phase(s) of the electrical circuit using the same method, but without requiring a measurement other than a signal representing a voltage of the medium voltage circuit.

To achieve this, the invention relates to a method of estimating a periodic voltage, such as an input voltage, of one of the phases of an electrical circuit with at least two phases comprising a voltage sensor for each of its phases, each voltage sensor being capable of outputting a signal representative of at least a part of period of the periodic voltage of said phase, the method comprising the following steps:

measure the signal representative of at least a portion of period of the periodic voltage of the phase starting from the voltage sensor,
  amplify the representative signal by a gain determined in the absence of an electrical fault in the circuit and based on a reference voltage common to all phases in the electrical circuit,
  use the amplified representative signal to estimate the voltage.

With such an estimating method, the gain can be used to obtain an estimated voltage normalised relative to a reference voltage common to all phases of the electrical circuit. Thus, the estimated voltage of a phase is comparable with the other voltage(s) estimated for the other phase(s). Furthermore, since this gain is determined when there is no electrical fault, it takes account of the variability of circuit components such as values of capacitors on which voltage sensors are installed, and the electrical network, and can thus provide voltages that are comparable between the phases.

Although it is important to be able to compare phase voltages with each other in order to determine their direct, inverse and/or zero sequence components and to monitor the electrical circuit, precise values are not very useful. Therefore the method according to the invention is capable of satisfying this problem of comparing voltages between phases without requiring an additional measurement, such as a measurement made on a low voltage circuit as was the case in prior art. Furthermore, since the gain is determined only when there is no electrical fault in the circuit and therefore no phase unbalance, the voltages remain usable even if there is a circuit failure.

Such a method can thus be used in various applications particularly for measurement of three-phase voltages of a medium voltage circuit (measurement of voltages, phase determination, determination of direct, inverse and/or zero sequence components, amplitude, phase calculations, etc.), determination of powers (calculation of active, reactive, apparent power, calculation of energy in the four quadrants), determination of the presence of medium voltage (particularly to enable/disable fault detection and protection algorithms, etc.), detection and identification of faults (determination of the residual voltage to analyse the nature of the fault (permanent or intermittent), directional detection of the fault by the most accurate possible detection of the polarisation voltage) and determination of the primary voltage frequency and phase to optimise sampling.

The duration of the portion of period of the periodic voltage may be less than 8 ms, or even 1 ms or even 100 µs. Usually, the duration of the portion of period of the periodic voltage could by a ratio of half the period duration of the periodic voltage. So, for a periodic voltage with a frequency of 60 Hz, the half the period duration being ~8 ms, the portion of period duration could be for example 80 µs which is a hundredth of the half of the period duration of the periodic voltage, or 8 µs which is a thousandth of the half of the period duration of the periodic voltage.

The voltage sensor is capable of outputting a signal representative of at least a part of period of the periodic voltage of said phase, the part of period of the periodic voltage is a part of period greater than the portion of period measure during the measuring step. Usually the part of period of the periodic voltage could be half a period of said periodic voltage such as an positive alternation.

In the following and throughout the remainder of this document, an electrical fault in the circuit means any electrical fault corresponding to a fault in at least one of the phases relative to the other phases such as a phase unbalance or an earth fault A gain determination step may be included, said step comprising the following sub-steps once every n iterations, where n is a positive integer greater than 1:
 detect an electric fault if there is one,
 if no electrical defect is detected, calculate the gain based on the representative signal and the reference voltage, a gain calculated during a previous determination step being kept if an electrical fault is detected.

In this way, the gains used are not affected by an electrical fault or malfunction in the circuit or the network. Thus, the estimated voltages are reliable even in these cases.

The sub-step to detect an electrical fault may comprise the following operations:
 determine at least one value among the values of the maximum voltage and the minimum voltage of the representative signal starting from variations in the representative signal measured during a given duration of time, the same value being determined for the other phase(s) of the electrical circuit,
 compare said value with values obtained for the other phase(s), an electrical fault being detected if the value obtained for one of the phases is different from the value obtained for the other phase(s) of the circuit.

Such a fault detection is particularly suitable to identify an electrical fault in a circuit with several phases. With such steps, it is thus easy to detect a phase unbalance or even an earth fault.

The sub-step to calculate the gain if no electrical fault is detected may include the following operations:
 determine the averaged amplitude of the representative signal during an analysis duration,
 calculate the gain from the averaged amplitude during the analysis duration and the nominal reference voltage, this calculation preferably being made using the following equation:

$$GX = \frac{Vnom}{\|VXr\|}$$

where GX is the gain, Vnom is the reference voltage, $\|VXr\|$ is the amplitude averaged over the analysis duration
 the previous gain calculated during a previous determination step being kept if an electrical fault is detected.

Such a calculation can provide a perfectly normalised estimated voltage, the gain being based on an averaged amplitude.

The estimating step may include the following sub-step:
 apply a preferably recursive type of low pass filter to the amplified representative signal.

The recursive low pass filter may comprise the following operations:
 detect a variation of the amplified representative signal greater than an activation threshold value, such a variation being the signature of a high frequency noise,
 if a variation of the amplified representative signal greater than the threshold detection value of a high frequency noise is detected, recursively estimate the amplified representative signal so as to attenuate the detected high frequency noise.

Such low pass filters can provide a usable estimated voltage even when the sensor that supplies the representative signal is affected by high frequency noise. It should also be noted that a recursive filter is particularly advantageous when the sensor can only supply a signal representative of one type of alternation of the periodic voltage to be estimated.

The voltage sensor may be a sensor adapted to output a signal representative of a portion of period of the periodic voltage, in which the estimating step includes a sub-step to:
 set the estimated representative signal to zero outside the part of period represented by the representative signal.

The estimating step may include the following sub-step:
 vectorise the amplified representative signal.

Such a vectorisation step is particularly advantageous to process the representative signal in order to compensate for phase shifts and/or the lack of a type of alternation of the periodic voltage to be estimated in the representative signal.

The voltage sensor may be a sensor adapted to output a representative signal from a differentiating or integrating element such as a voltage measured on a capacitor in the electrical circuit and the estimating step including a sub-step to:
 shift the phase of the amplified representative signal by 90°.

The invention also relates to a device for estimating a periodic voltage to estimate a voltage in a phase of an electrical circuit with at least two phases, such as an input voltage to the electrical circuit, the electrical circuit comprising a voltage sensor for each of its phases capable of outputting a signal representative of at least a part of the periodic voltage, The estimating device comprising:
 a measurement unit configured to measure a signal representative of at least a portion of period of the periodic voltage starting from the voltage sensor,
 an amplification unit configured to amplify the representative signal obtained by the measurement unit by a gain determined when there is no electrical fault in the electrical circuit and based on a reference voltage common to all phases in the electrical circuit,
 an estimating unit configured to estimate the voltage using the amplified signal representative of the voltage output by the amplification unit.

The amplification unit may comprise a recursive filter module configured to apply a recursive low pass filter to the amplified representative signal.

Such estimating devices using a method according to the invention benefit from the advantages associated with the method.

The invention also relates to an electrical circuit with at least two phases comprising a voltage sensor for each of its phases capable of outputting a signal representative of at least a part of the periodic voltage comprising an estimating device according to the invention.

The advantages of such a circuit are similar to the advantages of the estimating device according to the invention, installed in the circuit.

BRIEF DESCRIPTION OF THE DRAWINGS

This invention will be better understood after reading the description of example embodiments given purely for information and in way limitative with reference to the appended drawings in which.

Identical, similar or equivalent parts of the different figures have the same numeric references to facilitate comparison between the different figures.

The various possibilities (variants and embodiments) should be understood as not being exclusive of each other and they may be combined with each other.

DETAILED PRESENTATION OF PARTICULAR EMBODIMENTS

Figure 1:
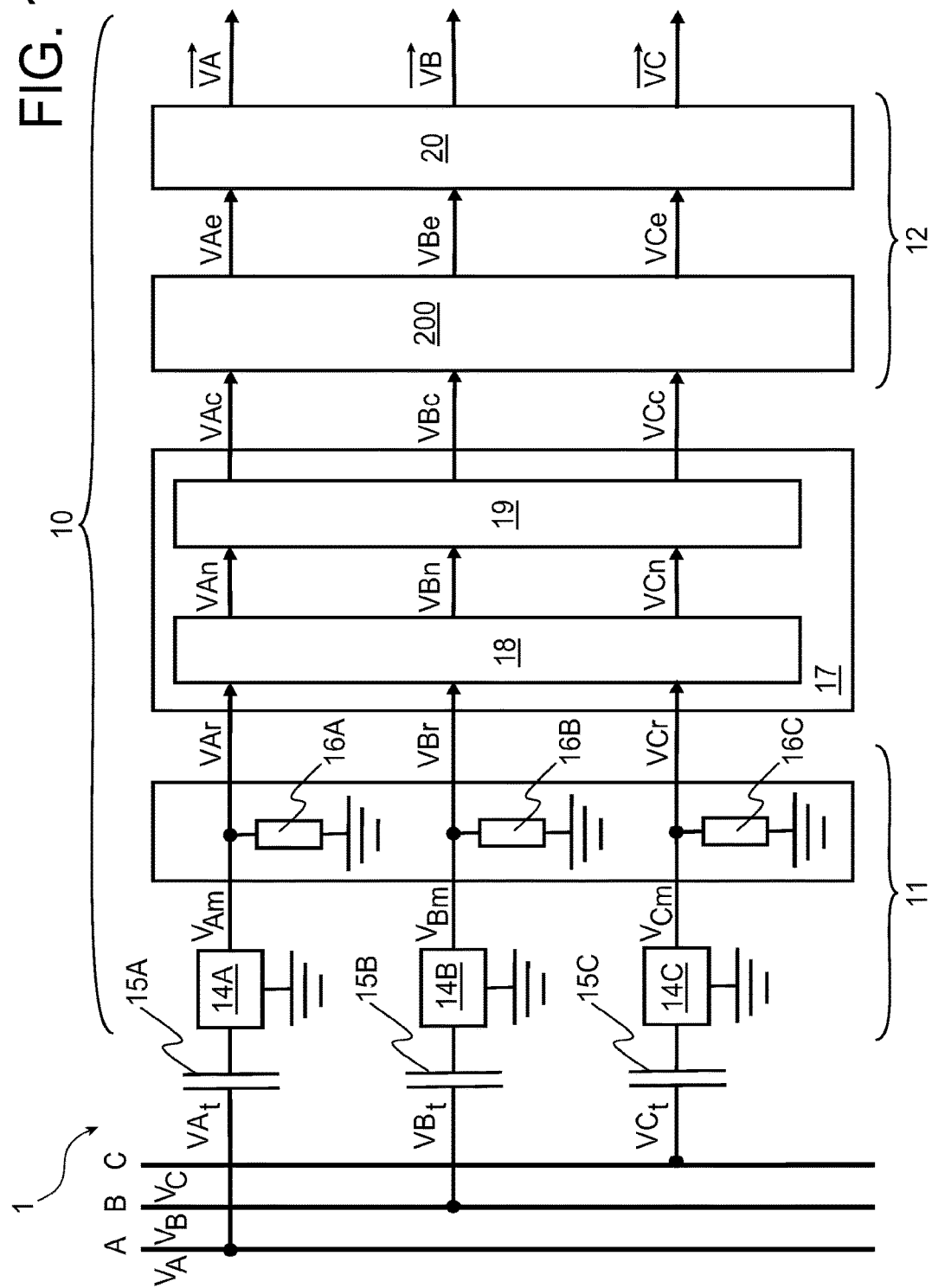
FIG. 1 is a functional diagram of a medium voltage circuit in which a voltage estimating device according to the invention is installed.

FIG. 1 is a functional diagram of a three-phase electrical circuit such as a medium voltage/low voltage transformer circuit comprising a medium voltage circuit and a low voltage circuit, the low voltage circuit not being shown, and a device for estimating a voltage of the medium voltage circuit of the transformer for each phase.

The medium voltage circuit also comprises at least one capacitor bushing 15A, 15B, 15C for each of its phases and a voltage sensor such as a Voltage Presence Indicator System (VPIS) 14A, 14B, 14C associated with this capacitor bushing.

Note that, the suffixes A, B, C are used to represent a first, second and third phases of the electrical circuit in the references given above and throughout the remainder of this document, and for all the variables used below. If it is not intended to reference a particular phase, the suffixes A, B, C will be replaced by the suffix X. Thus, when the suffix X is used in references and variables in the following, X may be replaced by any one of the suffixes A, B and C.

The voltage presence indicator system 14A, 14B, 14C can be used to recover a representative signal VAm, VBm, VCm representing positive alternations of the voltage VAt, VBt, VCt at the terminals of the capacitor bushing 15A, 15B, 15C. Thus, each voltage presence indicator 14A, 14B, 14C is capable of outputting a signal VAm, VBm, VCm representative of a part of period of the positive alternations of the input voltage VA, VB, VC to one of the phases of the medium voltage circuit. The voltage at the terminals of the capacitor bushing 15A, 15B, 15C corresponds to a derivative of the input voltage VA, VB, VC of the corresponding phase of the electrical circuit 1.

The estimating device 10 comprises the following as shown in FIG. 1:

- a measurement unit 11 configured to measure the measured signal VAm, VBm, VCm representative of at least a portion of the voltage VAt, VBt, VCt of the capacitor bushings 15A, 15B, 15C starting from the corresponding voltage presence indicator system 14A, 14B, 14C,
- an amplification unit 17 configured to filter and adapt the representative signal obtained by the measurement unit 11 for each phase by a gain GA, GB, GC determined for each phase in the absence of an electrical fault in the electrical circuit 1 and based on a reference voltage Vnom common to all phases in the electrical circuit 1,
- an estimating unit 12 configured to estimate the voltage VA, VB, VC from the amplified signal VAc, VBc, VCc representative of the voltage output by the amplification unit 17.

Figure 2:
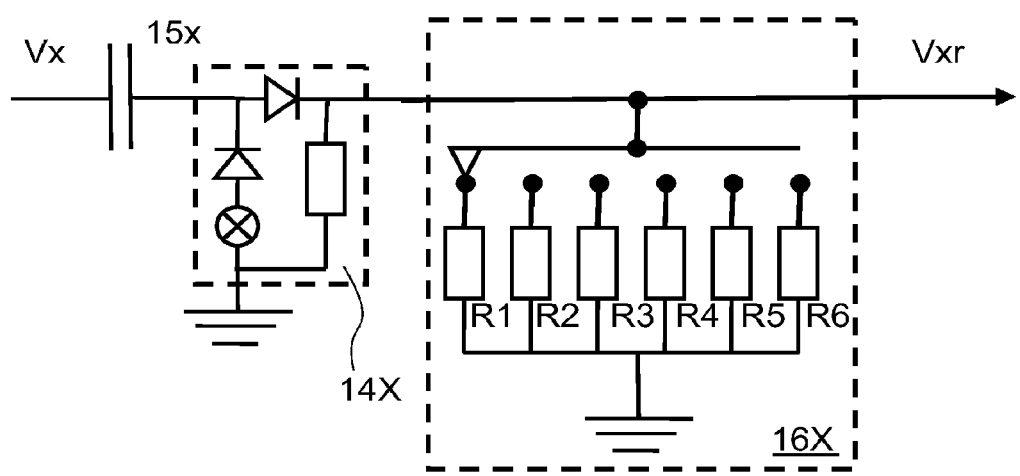
FIG. 2 is a functional diagram of part of the estimating device illustrated in FIG. 1 that forms a measurement unit of a signal representative of a voltage in the medium voltage circuit.

With reference to FIG. 2, the measurement unit 11 comprises:

- a voltage presence indicator system 14A, 14B, 14C for each phase,
- a matching resistance system 16A, 16B, 16C, illustrated in FIG. 2 for each phase, Each matching resistance system 16A, 16B, 16C can vary the resistance value through the choice of one of the available resistances, in this case six resistances R1, R2, R3, R4, R5 and R6, such that during initialisation of the corresponding voltage presence indicator system 14A, 14B, 14C, the representative signal VAr, VBr, VCr provided at the output from the voltage presence indicator system is as close as possible to the expected value of the reference voltage Vnom. Typically, the representative signal VAr, VBr, VCr is considered to be approximately equal to the expected value of the reference voltage Vnom when its amplitude is between half and twice the amplitude of the voltage to be estimated.

Thus, the measurement unit 11 can provide a signal VAr, VBr, VCr representative of a voltage of the medium voltage electrical circuit 1 for each phase, starting from the voltage presence indicator systems 14A, 14B, 14C. The representative signal VAr, VBr, VCr is then transmitted to the amplification unit 17.

Figure 3:
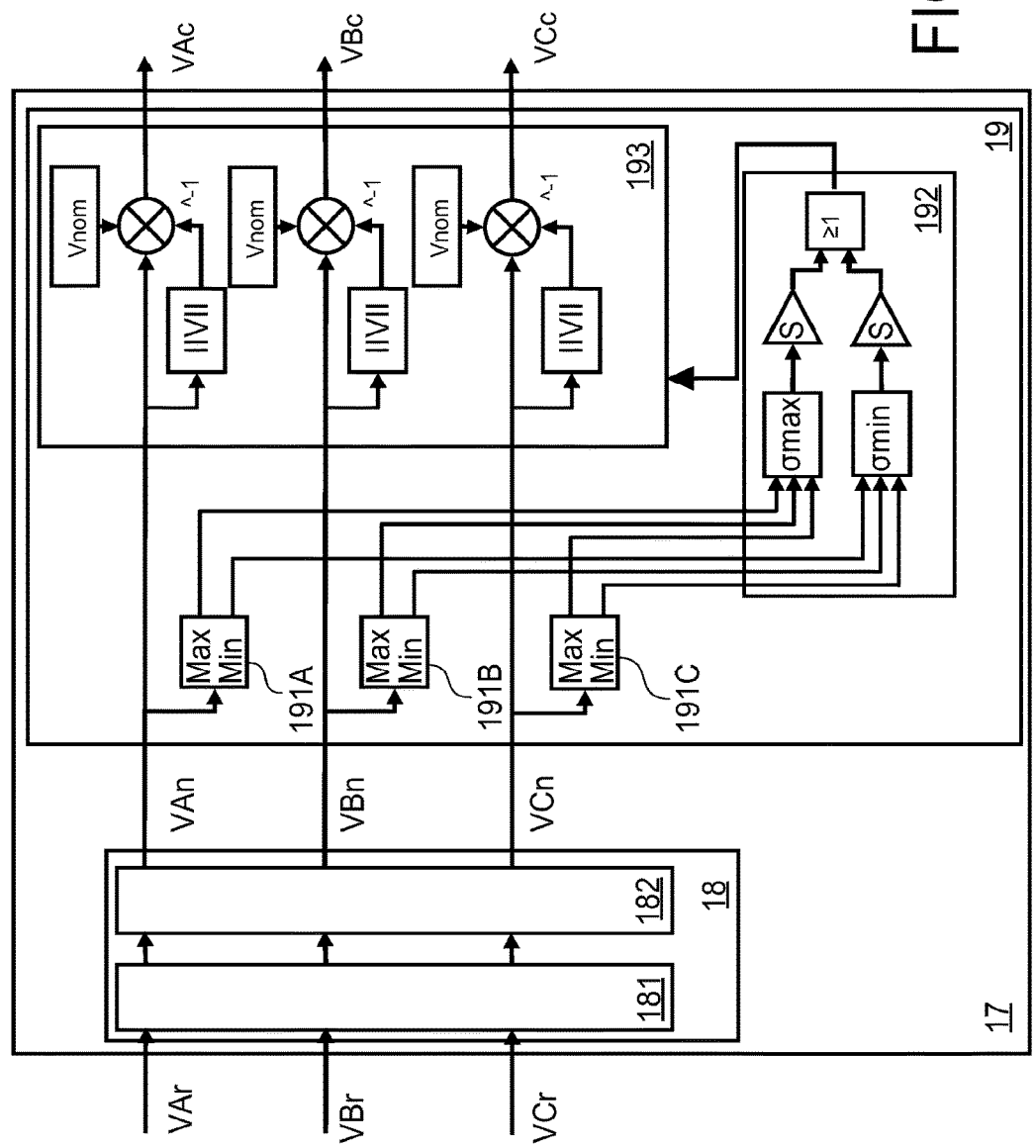
FIG. 3 is a functional diagram of part of the estimating device illustrated in FIG. 1 that forms an amplification unit of the representative signal obtained from the measurement unit.

With reference to FIG. 3, the amplification unit 17 comprises:

- a low pass filter 181,
- a digital-analogue converter 182, the low pass filter 181 and the digital analogue converter 182 being provided in the form of a digitisation sub-module 18,
- for each phase, an determination element 191A, 191B, 191C to determine the maximum voltage VAmax, VBmax, VCmax and the minimum voltage VAmin, VBmin, VCmin of the digitised representative signal VAn, VBn, VCn, an electrical circuit fault detection system 192 configured to determine the presence of a fault in the electrical circuit from the maximum voltages VAmax, VBmax, VCmax and the minimum voltages VAmin, VBmin, VCmin, a calculation system 193 configured to calculate a gain GA, GB, GC in the absence of a fault in the electrical circuit 1 for each phase and starting from averaged measurements of voltage amplitudes ||VAr||, ||VBr|| and ||VCr|| and a reference voltage Vnom, said calculation system 193 also being adapted to apply the gain GA, GB, GC to the corresponding digitised representative signal so as to provide an amplified representative signal VAc, VBc, VCc, for each of the phases.

In the configuration shown in FIG. 3, the determination elements 191A, 191B, 191C, the detection system 192 and the calculation system are arranged in the form of an amplification module 19.

Thus, the representative signal output by the resistance variation system 16A, 16B, 16C is then filtered by the low pass filter 181 to eliminate frequencies higher than 0.5 times the sampling frequency of the digital-analogue converter 182 from the representative signal.

The representative signal VAn, VBn, VCn thus digitised by the digital-analogue converter 182 is then transmitted to the amplification module 19.

The determination elements 191A, 191B, 191C analyse the digitised representative signal VAn, VBn, VCn for an analysis duration so as to determine the maximum voltages VAmax, VBmax, VCmax and the minimum voltages VAmin, VBmin, VCmin reached by the representative signal VAr, VBr, VCr during the analysis duration. The maximum voltages VAmax, VBmax, VCmax and the minimum voltages VAmin, VBmin, VCmin thus determined are transmitted to the electrical circuit fault detection system 192. Typically, the analysis duration is chosen so as to cover a significant number of periods of the representative signal, usually an analysis duration of one second is quite suitable.

The detection system 192 is configured to compare the maximum voltages VAmax, VBmax, VCmax obtained for each phase of the circuit and thus detect a possible unbalance between phase voltages. This detection system is also capable of comparing the minimum voltages VAmin, VBmin, VCmin obtained for each phase in the circuit and thus detect a possible unbalance in the voltage of the phases. Such an unbalance, either in the maximum voltages VAmax, VBmax, VCmax or the minimum voltages VAmin, VBmin, VCmin, is clearly representative of a signature of a fault or a malfunction of the electrical circuit, such as an earth fault or a non-zero residual voltage.

For example, such a comparison can be made by verifying if the difference between the three maximum voltages VAmax, VBmax, VCmax and the average of these three same voltages is less than 10%, any larger difference being identified as being the signature of an electrical fault in the circuit.

If the detection system 192 detects an electrical fault, a notification is sent to the calculation system 193.

In this way, if the detection system 192 detects an electrical fault in the circuit, the gains GA, GB, GC are not recalculated based on the corresponding averaged amplitudes ||VAr||, ||VBr|| and ||VCr|| for which a fault was detected based on voltages VAmax, VBmax, VCmax, VAmin, VBmin, VCmin.; the previous value of the gain GA, GB, GC is then kept for each phase.

On the other hand, if the detection system 192 does not detect an electrical fault in the electrical circuit 1, the calculation system 193 calculates the gain GA, GB, GC for each phase. As shown in FIG. 3, this calculation is made based on the following equation:

$$GX = \frac{Vnom}{\|VXr\|} \quad (1)$$

where GX is the gain for the given phase, ||VXr|| is the amplitude averaged over the analysis duration, and Vnom is the reference voltage.

Such a calculation of the gain GA, GB, GC for each phase does not need to be done continuously. Although the capacitance of the capacitors 15A, 15B, 15C may fluctuate in time due to temperature variations and aging, this fluctuation is slow. Thus, according to one possibility of the invention, the gains GA, GB, GC may be calculated regularly, for example once every hour.

Obviously, the detection of an electrical fault in the circuit may be made only during the calculation of the gains GA, GB and GC, or continuously, or regularly at a frequency higher than the frequency at which the gains GA, GB, GC are calculated, it being understood that a fault detection takes place during calculation of the gains GA, GB and GC. According to this possibility for which the gains GA, GB, GC are calculated regularly and non-continuously, the values of the gains GA, GB, GC are kept between two calculations in the same way as when an electrical fault is detected in the circuit.

The calculation unit can use the gains GA, GB, GC thus determined to amplify the digitised representative signal VAn, VBn, VCn by applying the following amplification equation:

$$VXc = GX \times VXn \quad (2)$$

where VXc is the amplified representative signal for a phase, GX is the gain corresponding to this phase and VXn is the digitised representative signal for this phase.

The amplitude of the representative signal thus amplified VAc, VBc, VCc is normalised by means of the reference voltage Vnom. Since this reference voltage Vnom is common to all phases and the gains GA, GB, GC are calculated when there is no electrical fault, the amplified representative signals VAc, VBc, VCc are balanced with each other and have an approximately equal amplitude.

The amplified representative signal VAc, VBc, VCc is transmitted to the output of the amplification module 19 and is then transmitted to the estimating unit 12.

With reference to FIG. 1, the estimating unit 12 comprises:

a recursive filter module 200, and
a vectorisation module 20.

The recursive filter module 200 is configured to limit the high frequency noise present on the amplified representative signal and it may also be called the recursive low pass filter.

Figure 4:
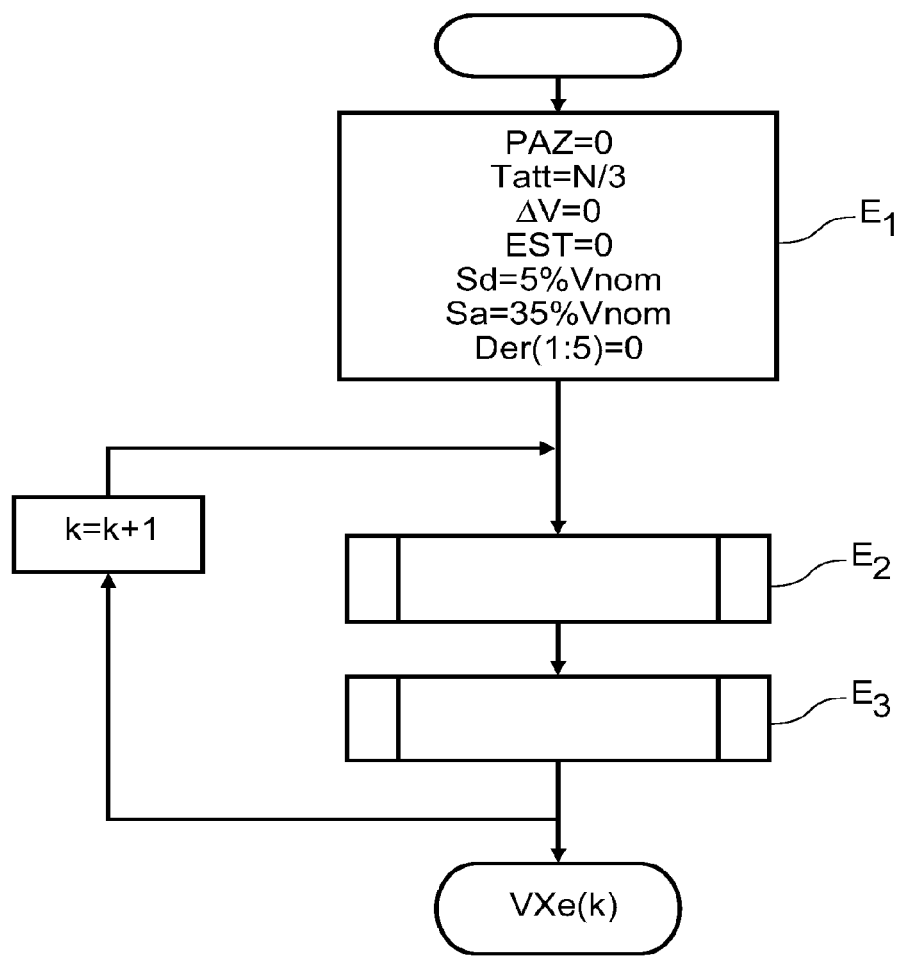
FIG. 4 is a flow chart showing the general operation of the part of the device illustrated in FIG. 1 that forms an estimating unit.
Figure 5:
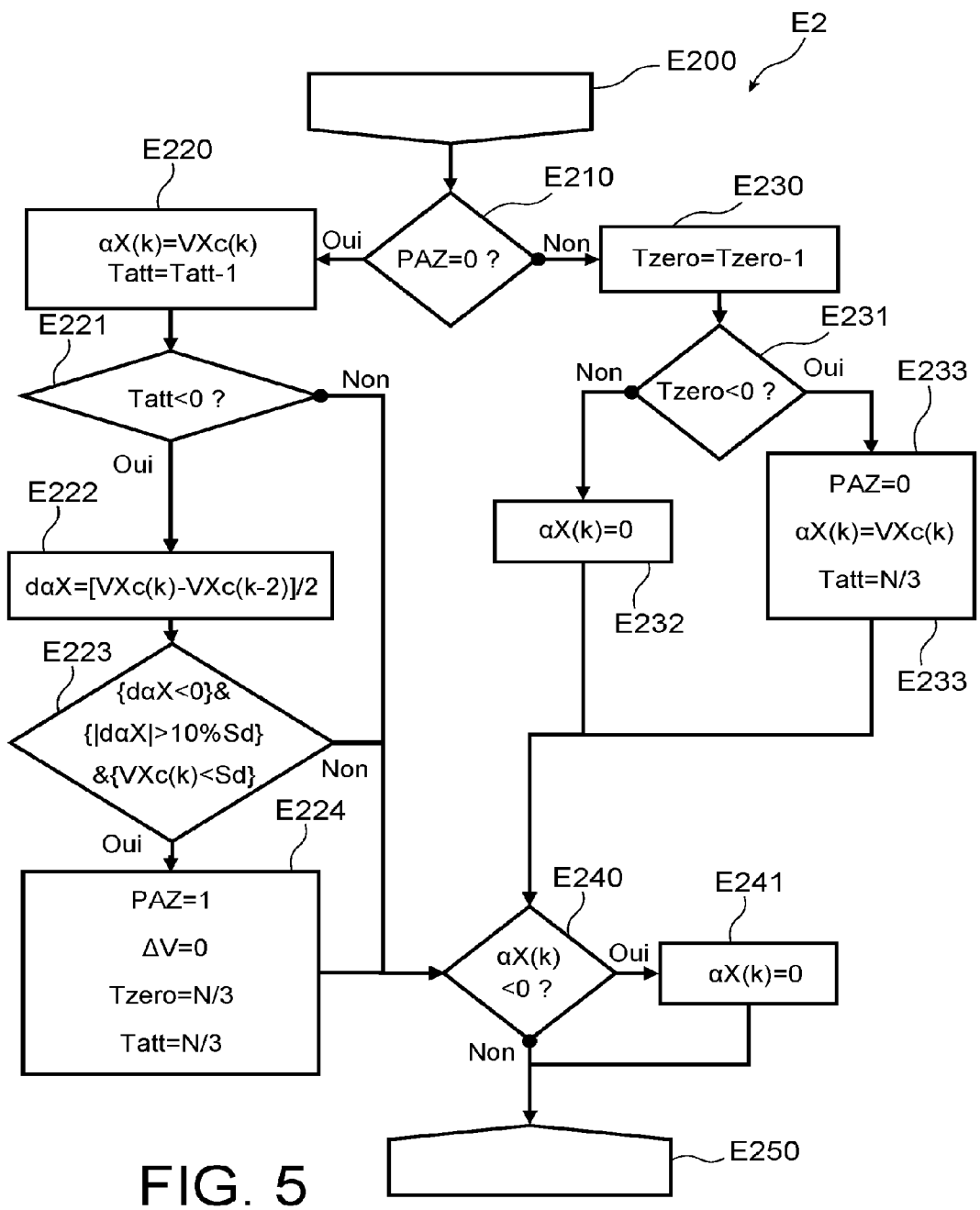
FIG. 5 is a flow chart illustrating the sub-steps in a first filter step in the flow chart illustrated in FIG. 4.
Figure 6:
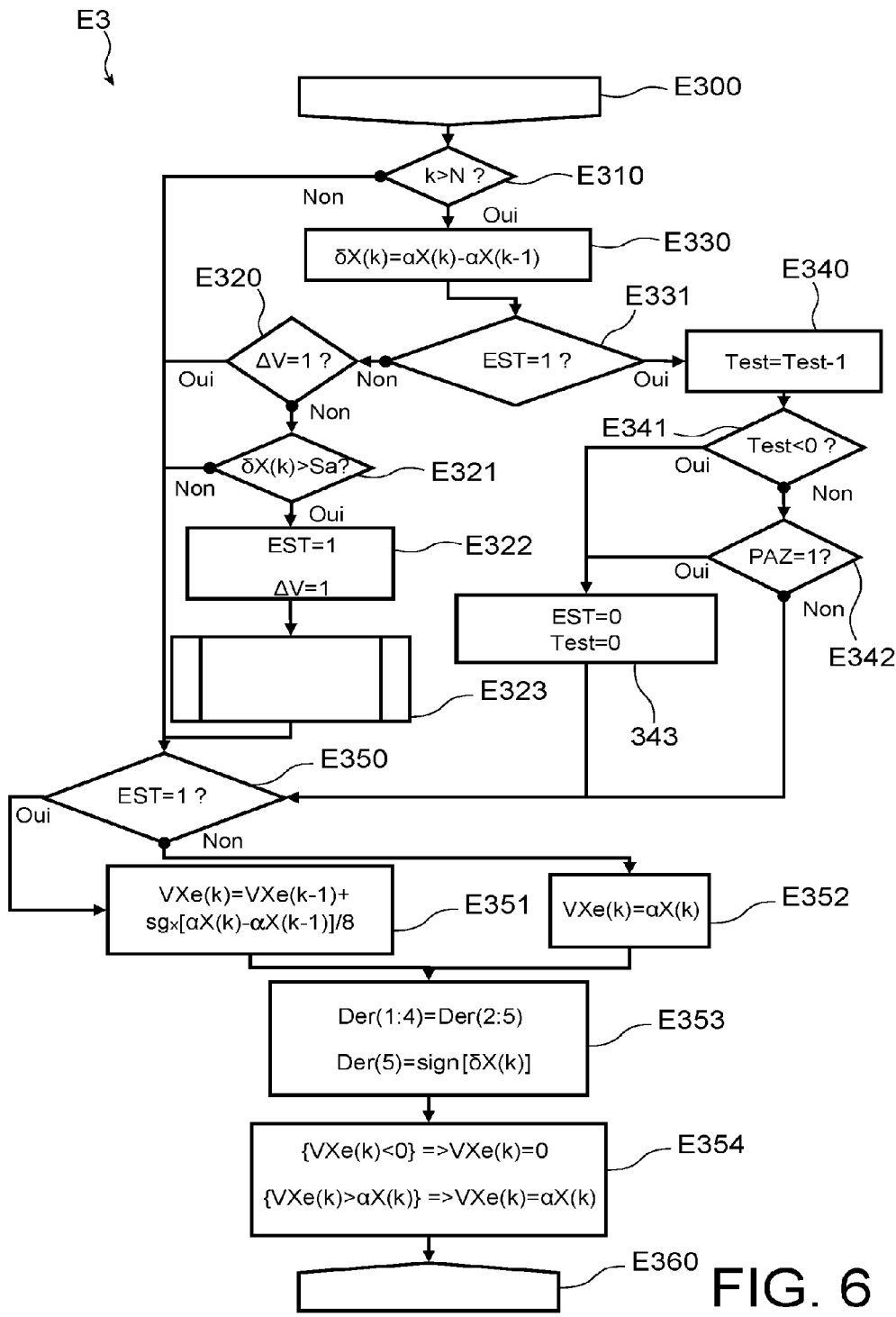
FIG. 6 is a flow chart illustrating the sub-steps in a second filter step in the flow chart illustrated in FIG. 4.

The recursive filter module 200 operates according to the method illustrated in the flow charts in FIGS. 4, 5 and 6.

Thus as shown in FIG. 4, the recursive filter module 200 is configured to repeat the following general steps at each time increment starting from the amplified representative signal, after a step E1 to initialise the method:

an end of part of period detection step E2 corresponding to positive alternations by detection of a decreasing passage through zero and setting portions of period corresponding to negative alternations to zero, and a recursive filter step E3 as such.

The following parameters of the method are initialised during the initialisation step E1 of the method:

PAZ, a state variable that is set equal to the value 1 if a decreasing passage through zero was detected, is set to 0, Tatt, a waiting time after the beginning of a position alternation of the amplified representative signal, during which detection of a passage through zero is deactivated, this variable in this case being fixed to a third of a period N, ΔV, state variable of detection of a variation of the amplified representative signal VAc, VBc, VCc, that is set to 1 when a variation of the amplified representative signal VAc, VBc, VCc is detected, is set to 0, EST, state variable of activation of the estimate of the amplified representative signal that is set equal to 1 when estimating is activated, is set to 0, Sd, constant fixing the detection threshold for detection of the next decreasing passage through zero, this constant may for example be fixed to 5% of the reference voltage Vnom, Sa, constant fixing the estimating activation threshold, where Sa is a value of the activation threshold starting from which a variation of the amplified signal is considered as being a signature of detection of a high frequency noise that has to be filtered, this constant for example being fixed equal to 35% of the reference voltage Vnom, Der(1) to Der(5), the state values of a sliding state table of the last 5 signs of the variation of a buffer value δX(k) obtained for iterations k to k−4, are set to 0.

Note that the method also uses ten other variables that are not initialised during the initialisation step E1:

k, a time increment representing the time variable with k×N that is equal to the period of the voltage to be estimated, where N is the number of samples per period of the voltage to be estimated, αX(k) is a buffer value into which the amplified representative signal VAc, VBc, VCc is transferred or is forced to 0, dαX that represents the average variation of the amplified representative signal VAc, VBc, VCc for the duration of two time increments, Tzero that is a time variable used to force samples to zero after detection of a decreasing passage through zero, Test that is a time variable that fixes the duration during which estimating is activated, VXe(k) that is the value of the estimated representative signal, δX(k) that is the variation of the buffer value αX(k) in iteration k calculated between iteration k and iteration k−1, sg is a state variable for the average slope of the representative signal, that is equal to the value +1 for an increasing slope and the value −1 for a decreasing slope, p and n are the variables of the number of positive and negative variations respectively obtained during the last 5 iterations based on the sliding table Der(1) to Der(5)

FIG. 5 is a flow chart illustrating the chaining of sub-steps in the detection step E2. Thus, the detection step E2 comprises the following sub-steps and operations:

E210 verification if a decreasing passage through zero has not already been detected, by verifying the state of the state variable PAZ, E220 if the state variable PAZ is equal to 0 and therefore no decreasing passage through zero was detected, the value αx(k) of the detection buffer is fixed to the value of the signal VXc(k) using the following equation αX(k)=VXc(k), and the waiting time Tatt is decremented;

E221 verification if the waiting time Tatt is less than 0,

E222 if the waiting time Tatt is less than 0, in other words the beginning of a negative alternation was detected more than two thirds of a period earlier, calculate the average variation of the representative signal dαx(k) using the equation $$d\alpha X = \frac{(VXc(k) - VXc(k-2))}{2},$$

E223 detection of a decreasing passage through zero by checking if the following relations are satisfied dαX<0 and |dαX|>(10%×Sd) and VXc(k)<Sd, E224 if a decreasing passage through zero is detected in sub-step E223, initialisation of PAZ to 1 and ΔV to 0, Tzero and Tatt being fixed to N/3, E240 verification of the sign of the value αX(k), E250 if αX(k) is zero or if its sign is positive, go on to the recursive filter step E3, if the variable Tatt at E221 is greater than 0, go directly on to E240 without passing through E222 to E224, similarly, if at least one of the relations is not satisfied in E223, a decreasing passage through zero is not detected and step E240 is started directly, if the state of the state value PAZ in E210 is not equal to 0 and therefore a decreasing passage through zero has been detected, E230 to decrement the variable Tzero by 1, E231 verify that a passage through zero was detected more than two thirds of the period earlier by checking that Tzero is positive, E232, if Tzero is positive, set the variable αx(k) to 0, if Tzero is negative in E231), E233) initialise the state variable PAZ to 0, transfer the value of VXc(k) into the variable αX(k), and fix Tatt to N/3, after E232 and E233, go on to E240.

In this way, the values of Vxc(k) are transferred into αX(k) when the representative signal is in positive alternation (E220 to E224) and αX(k) is set to 0 in a negative alternation (E232) with elimination of negative values of Vxc(k) in both cases (E240 and E241), these values necessarily being related to the noise of the voltage presence indicator system 14A, 14B, 14C.

The recursive filter step E3 includes the following sub-steps and operations:

E310 verification if a first initialisation of the filter step has already taken place, checking that k is greater than N, in other words that a first period of the representative signal has already been filtered, if the first initialisation has not yet taken place, E350 check the state of the EST state variable, if the state of the state variable EST is equal to 1, E351, start from the same value VXe(k) obtained in the previous iteration, of the state variable of the average slope, of the representative signal sg and of the variation of the buffer value between the current iteration αX(k) and the previous iteration αX(k−1) for estimating the estimated value VXe(k) of the representative signal using the following equation $$VXe(k) = VXe(k-1) + sg \times \frac{(\alpha X(k) - \alpha X(k-1))}{8},$$

Figure 7:
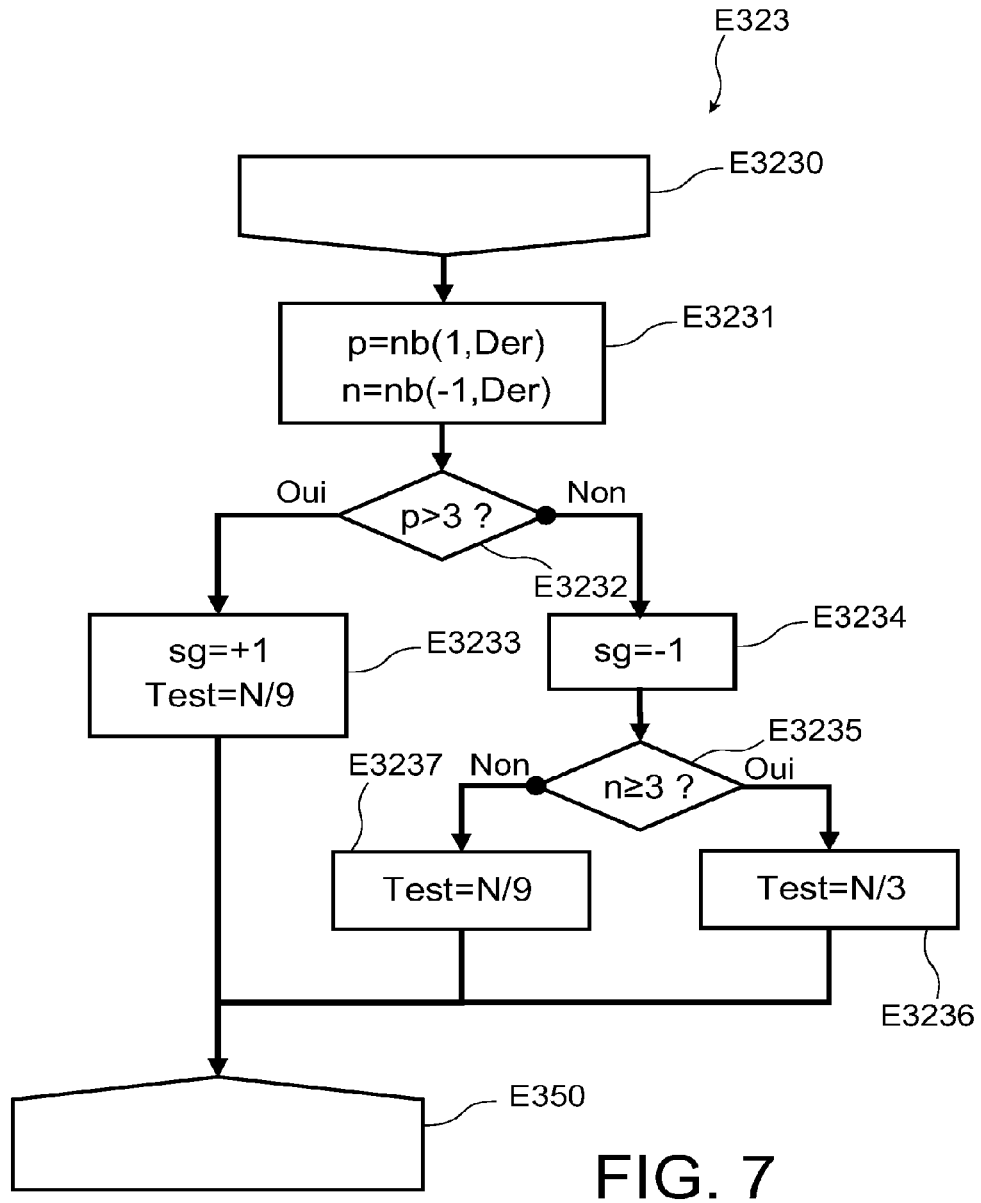
FIG. 7 is a flow chart of slope determination operations used during a sub-step of the flow chart in FIG. 6, FIGS. 8A, 8B and 8C all illustrate the voltage in one of the phases of an electrical circuit and the different electrical signals obtained when using an estimating method according to the invention.

E353 slide values in the Der table, with states Der(1:4) that are derived from an iteration to be transferred into Der(2:5), the sign of the variation of the buffer value being transferred into Der(5), E354, correction of estimated values, by checking if the estimated value VXe(k) is positive, the estimated value then being set to 0 if it is not positive, and verifying that the estimated value VXe(k) is not greater than the buffer value αx(k), the buffer value being transferred into the estimated value VXe(k) if the latter value is greater than the buffer value αX(k), E360 transmission of the estimated value VXe(k) to the vectorisation module 20, if the first initialisation of the filter step has already taken place in step E310, E330 calculate the variation of the buffer value αX(k) between iteration k and iteration k−1 using the following equation δX(k)=αX(k)−αX(k−1), E331 check the state of the state variable EST, if the state of the state variable EST is zero, E320 verification of the state of the state variable ΔV, if the state of the state variable ΔV is equal to 1, go on to step E350, if the state variable ΔV is zero in step E320, E321 verification that the variation value δX(k) of the buffer value in iteration k is greater than the activation threshold Sa, If the variation value δX(k) of the buffer value in iteration k is less than or equal to the activation threshold Sa, go on to step E350, If the variation value δX(k) of the buffer value in iteration k is greater than the activation threshold Sa in E321, E322 change the state variables EST and ΔV to state 1, E323 sub-step to determine the state variable sg of the average slope of the representative signal and the time variable Test used to fix the duration during which the estimating is activated following the operations shown in the flow chart in FIG. 7, Go on to E350, If the state variable EST is set to state 1 in E331, E340 decrementation of the time variable Test by 1, E341 verification if the time variable Test has changed to a negative value, If the time variable Test has changed to a negative value, E343 change the state variable EST to 0 and set the time variable Test to 0 and then go on to E350, If the time variable Test is greater than or equal to 0 in E341, E342 check that a decreasing passage through zero has not been detected by checking that the state variable PAZ is equal to 1, if the state variable PAZ is equal to 1, go on to E343, if the state variable PAZ is equal to zero in E342, go on to E350, if the state variable EST is zero in E350, go on to E352 to transfer the buffer value αX(k) into the estimated value VXe(k), then go on to E353.

Thus, with such a recursive filter step, the estimated representative signal obtained is cleaned, because the portions of the representative signal corresponding to the negative alternations are set to zero and their high frequency noise is reduced due to the recursive estimate of sub-step E351 that is done if a high voltage variation is detected by sub-step E320 greater than the activation threshold Sa, such a variation being the signature of a high frequency noise.

Sub-step E323 allows the determination of the sign of the slope and the defining of the time window Test during which the recursive estimate of step E351 is applied.

Such a sub-step E323 comprises the following operations:

E3231 calculate variables p and n starting from the sliding table

Der(1:5), where p is the number of boxes in table Der(1:5) with the value 1, where n is the number of boxes in table Der(1:5) with the value −1, E3232 determine the presence of a positive slope, a positive slope being detected if p is greater than 3, E3233 if a positive slope is detected, the state variable Sg is changed to +1 and the time variable Test to N/9, E350 Go on to the next sub-step of step E3, namely E350, if no positive slope is detected in E3231, in other words p is smaller than or equal to 3, E3234 the state variable sg is changed to −1, E3235 detect a negative slope by determining if the variable n is greater than or equal to 3, if no negative slope is detected and therefore n is equal to 2, the time variable Test is changed to N/9, then go on to the next sub-step in step E3, namely E350, if a negative slope is detected in E3234, in other words the variable n is greater than or equal to 3, E3236 change the time variable Test to N/3, then go on to the next sub-step in step E3, namely E350.

In this way, the estimating window during which the representative signal is estimated is varied as a function of the slope, the slope being fixed to a ninth of a period in an up slope (p>3) and with a low slope (p=3 and n=2), and to a third of a period in the case of a negative slope (n≥3).

The representative signal after estimating by the recursive filter module 200 is transmitted to the vectorisation module 20.

The vectorisation module 20 is configured to apply a Discrete Fourier Transform to the estimated representative signal VAe, VBe, VCe also referred to as the TFD, in order to obtain a vector representation in the frequency space.

The vectorisation module 20 is also configured to shift the phase of the vectorised representative signal $\overrightarrow{VAe}, \overrightarrow{VBe}, \overrightarrow{VCe}$ so as to compensate for the phase shift caused by the fact that the representative signals VAr, VBr, VCr, were measured on capacitor bushings 15A, 15B, 15C. Similarly, the vectorisation module 20 is also configured to compensate for the fact that the measured representative signal only comprises positive alternations of the signal to be estimated. Such a phase shift and such a compensation for the loss of the negative alternations are made using the following vector transformation:

$$\overrightarrow{VX} = 2 \times e^{-j \times \frac{\pi}{2}} \times \overrightarrow{VXe} \qquad (3)$$

In other words $\overrightarrow{VX} = 2 \times (\text{Im}(\overrightarrow{Vxe}) - j \times \text{Re}(\overrightarrow{VXe}))$ Thus, the vectorisation module 20 can provide a vector image of the voltage of the electrical circuit 1 for each phase.

According to one variant of the invention in which the vectorisation module can also perform an additional low pass filter, the vectorisation module 20 may perform the following calculation after vectorisation of the representative signal as a variant to the phase shift and taking account of the single alternation nature:

$$\vec{VX} = \vec{VXe} + 2 \times \vec{VXe}_{-\pi/2} + \vec{VXe}_{-\pi} \quad (4)$$

Where $\vec{VXe}$ is the vectorised representative signal at a given instant, $\vec{VXe}_{-\pi/2}$ is the vectorised representative signal shifted by a quarter of a period and $\vec{VXe}_{-\pi}$ is the vectorised representative signal shifted by a half period of the representative signal.

Thus, such a voltage estimating device can be used to estimate a voltage in one of the phases of the circuit. Such an estimate is made using the estimating method including the following steps, sub-steps and operations:
- measure a signal VAm, VBm, VCm representative of a voltage of the phase of the circuit, in this case a voltage output by the voltage presence indicator,
- variation of the measured representative signal VAm, VBm, VCm using resistances R1, R2, R3, R4, R5 in the resistance variation system 16A, 16B, 16C,
- digitisation and amplification of the representative signal starting from the adapted representative signal VAr, VBr, VCr starting from a gain GA, GB, GC determined in the absence of an electrical fault in the circuit and based on the reference voltage Vnom common to all phases,
- clean the amplified representative signal VAr, VBr, VCr so as to reset the amplified representative signal to zero outside positive voltage alternations at the terminals of the corresponding capacitor bushing 15A, 15B, 15C,
- estimate the representative signal using a recursive filter, said filter being adapted to recursively attenuate high frequency noise during its detection,
- vectorisation of the estimated representative signal,
- phase shift of the estimated representative signal by −90° and amplification by a factor of 2.

The following operations are performed during the step to estimate the representative signal using a recursive filter:
- detection of a variation of the amplified representative signal greater than an activation threshold, such a variation being the signature of a high frequency noise,
- recursively estimate the amplified representative signal so as to attenuate high frequency noise when a variation of the amplified representative signal greater than an activation threshold is detected.

Figure 8A:
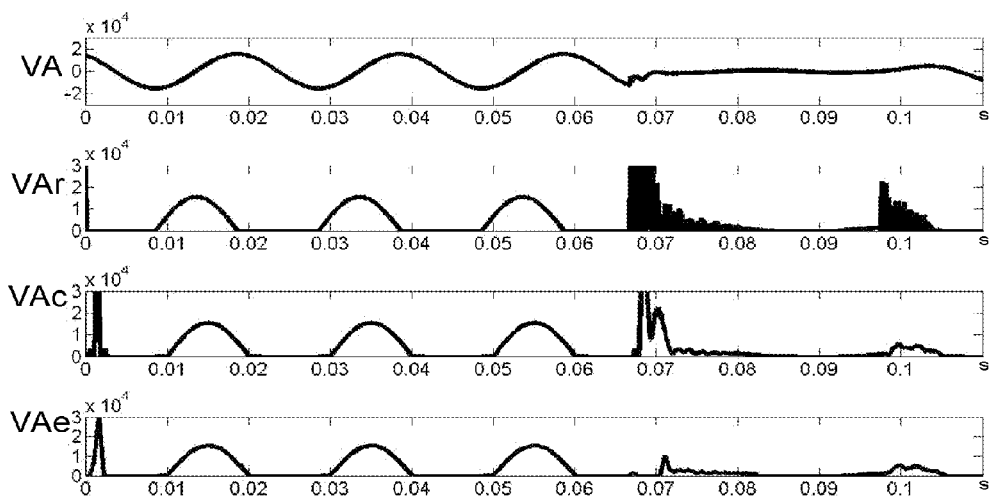
Figure 8B:
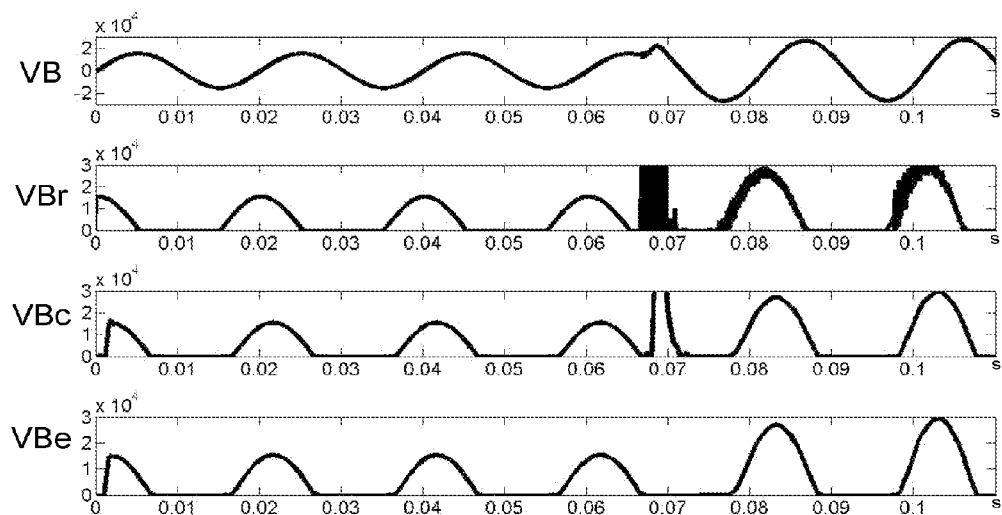
Figure 8C:
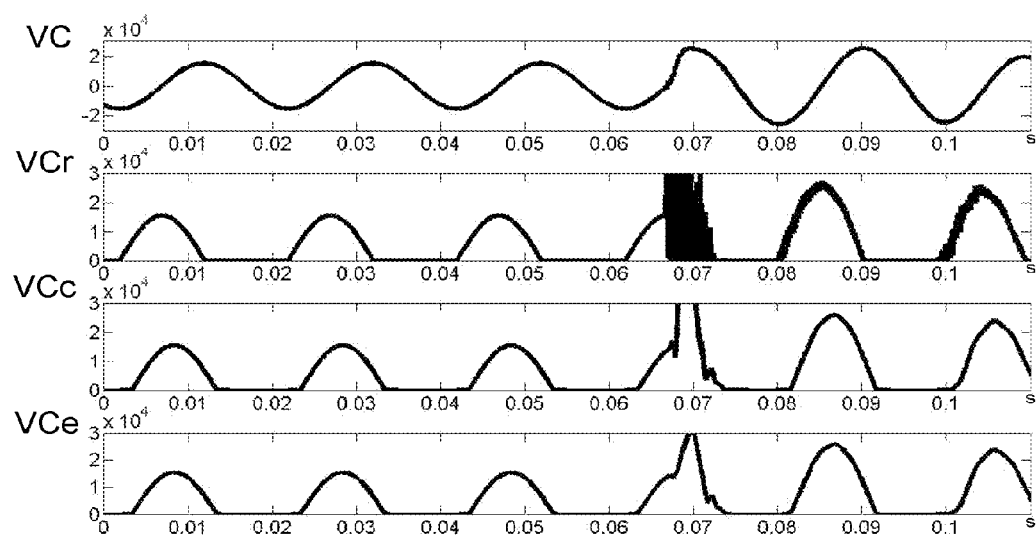

FIGS. 8A to 8C show the following for the first, second and third phases respectively of the electrical circuit:
- the input voltage VA, VB, VC to the medium voltage circuit,
- the adapted representative signal VAr, VBr, VCr,
- the amplified representative signal VAc, VBc, VCc, and
- the estimated representative signal VAe, VBe, VCe.

In these figures, the first part before 0.67 s represents a situation in which the electrical circuit 1 is good and has no electrical fault, while the second part after 0.67 s, represents a situation in which the circuit has a phase-earth fault on the first phase shown particularly in FIG. 8A.

It can thus be seen that in the absence of a fault, normalisation of the representative signal makes it possible to estimate voltages for phases that are perfectly comparable with each other and representative of real voltages applied to the electrical circuit 1. Similarly, voltages estimated in the presence of a fault on the first phase can be used to identify the fault, the estimate being usable to provide voltages representative of the situation despite the occurrence of the fault.

Obviously, if the voltage sensor in the embodiment disclosed above is a voltage presence indicator 14A, 14B, 14C, the invention can also be applied to another type of voltage sensor. Thus as a variant, each of the capacitor bushings 15A, 15B, 15C may be fitted with a voltage sensor of the Potential Takeoff with Separable Connection type, also known as PPACS.

With this variant, the estimating device and the estimating method are adapted since such a sensor provides access to the two alternations of the voltage of the equipped capacitor bushing 15A, 15B, 15C. Thus, the estimating unit 12 and the phase shift operation of the vectorisation module 20 are not necessary with such a variant of the invention.

The invention claimed is:

1. A method of estimating a periodic input voltage, the periodic input voltage being one phase of phases of an electrical circuit with at least two phases, the electrical circuit including a voltage sensor for the one phase, the voltage sensor outputting a signal representative of a part of a period of the periodic input voltage of the one phase, the method comprising:
    measuring the representative signal during at least a portion of the part of the period of the periodic input voltage of the one phase using the voltage sensor;
    amplifying the measured representative signal by a gain determined in the absence of an electrical fault in the electrical circuit and based on a reference voltage common to all phases in the electrical circuit; and
    estimating, using the amplified measured representative signal, the periodic input voltage.

2. The method according to claim 1, further comprising determining a gain, said determining including the following sub-steps once every n iterations, where n is a positive integer greater than 1:
    detecting an electric fault,
    if no electrical defect is detected, calculating the gain based on the measured representative signal and the reference voltage, a gain calculated during a previous determination step being kept if an electrical fault is detected.

3. The method according to claim 2, wherein the sub-step of detecting an electrical fault comprises the following operations:
    determining at least one value among the values of the maximum voltage and the minimum voltage of the measured representative signal using a variations in the measured representative signal measured during a given period of time, the same value being determined for the other phase(s) of the electrical circuit, and
    comparing said value with values obtained for the other phase(s), an electrical fault being detected if the value obtained for one of the phases is different from the value obtained for the other phase(s) of the circuit.

4. The method according to claim 2, wherein the sub-step of calculating the gain if no electrical fault is detected includes the following operations:
    determining an averaged amplitude of the measured representative signal during an analysis duration, and
    calculating the gain from the averaged amplitude during the analysis duration and the nominal reference voltage, the previous gain calculated during a previous determination step being kept if an electrical fault is detected.

5. The method according to claim 4, wherein during the operation of calculating the gain, the gain is calculated using the following equation:

$$GX = \frac{Vnom}{\|VXr\|}$$

where GX is the gain, Vnom is the reference voltage, ‖VXr‖ is the amplitude averaged over the analysis duration.

6. The method according to claim 1, wherein the estimating includes the following sub-step:
applying low pass filter to the amplified measured representative signal, the low pass filter being recursive.

7. The method according to claim 6, wherein the recursive low pass filter comprises the following steps:
detecting a variation of the amplified measured representative signal greater than an activation threshold value, the variation being a signature of a high frequency noise,
if the variation of the amplified representative signal greater than the activation threshold value is detected, recursively estimating the amplified measured representative signal so as to attenuate the detected high frequency noise.

8. The method according to claim 1, wherein the estimating includes the sub-step of:
setting the estimated representative signal to zero outside the part of the period represented by the measured representative signal.

9. The method according to claim 1, wherein the estimating includes the following sub-step:
vectorising the amplified measured representative signal.

10. The method according to claim 1, wherein the voltage sensor outputs the representative signal from a differentiating or integrating voltage measured on a capacitor in the electrical circuit and the estimating includes a sub-step of:
shifting the phase of the amplified measured representative signal by 90°.

11. An estimating device for estimating a periodic input voltage being one phase of an electrical circuit with at least two phases, the electrical circuit including a voltage sensor, for the phase, outputting a signal representative of a part of a period of the periodic input voltage of the phase, the estimating device comprising:
the voltage sensor configured to measure the signal during at least a portion of the part of the period of the periodic input voltage of the one phase,
an amplifier configured to amplify the measured representative signal obtained by the voltage sensor by a gain determined when there is no electrical fault in the electrical circuit and based on a reference voltage (Vnom) common to all phases in the electrical circuit, and
an estimating circuit configured to estimate the periodic input voltage using the amplified measured representative signal output by the amplifier.

12. The estimating device according to claim 11, in which the amplifier comprises a recursive filter configured to apply a recursive low pass filter to the amplified representative signal.

13. An electrical circuit with at least two phases comprising
a voltage sensor for one phase of the phases outputting a signal representative of a part of a period of a periodic input voltage, said circuit further comprising
an estimating device for estimating the periodic input voltage being the one phase of the electrical circuit with the at least two phases, the estimating device including:
the voltage sensor configured to measure the signal during at least a portion of the part of the period of the periodic input voltage of the one phase,
an amplifier configured to amplify the measured representative signal obtained by the voltage sensor by a gain determined when there is no electrical fault in the electrical circuit and based on a reference voltage (Vnom) common to all phases in the electrical circuit, and
an estimating circuit configured to estimate the periodic input voltage using the amplified measured representative signal output by the amplifier.

14. The method according to claim 1, further comprising:
correcting a failure or malfunction in the electrical circuit based on the estimated periodic input voltage.

\* \* \* \* \*